United States Patent [19]

Harrell et al.

[11] 4,222,656

[45] Sep. 16, 1980

[54] APPARATUS AND METHOD FOR PROCESSING EXPOSED LITHOGRAPHIC PLATES

[75] Inventors: Robert E. Harrell, Manchester; Tedd L. Harrell, Springfield, both of Mo.

[73] Assignee: Western Litho Plate & Supply Co., St. Louis, Mo.

[21] Appl. No.: 18,993

[22] Filed: Mar. 9, 1979

[51] Int. Cl.³ .............................................. G03D 5/04
[52] U.S. Cl. .................................. 354/317; 354/325; 118/314; 118/323
[58] Field of Search ............... 354/317, 318, 324, 325, 354/297; 118/109, 120, 314, 323; 134/64 R, 64 P, 122 R, 122 P.172, 198

[56] References Cited

U.S. PATENT DOCUMENTS

| | | | |
|---|---|---|---|
| 2,555,874 | 6/1951 | Coughlin | 354/317 |
| 2,815,298 | 12/1957 | Heffley | 118/323 |
| 3,448,720 | 6/1969 | Graham | 118/314 |
| 3,593,641 | 7/1971 | Adams | 354/317 |
| 3,608,464 | 9/1971 | Harrell et al. | 354/317 |
| 3,621,772 | 11/1971 | Bogue | 354/317 |
| 3,682,078 | 8/1972 | Parker et al. | 118/120 |
| 3,719,133 | 3/1973 | Haracz | 118/120 |
| 3,782,532 | 1/1974 | Harrell et al. | 198/688 |
| 4,128,326 | 12/1978 | Selak | 354/317 |
| 4,145,135 | 3/1979 | Sara | 354/317 |

Primary Examiner—L. T. Hix
Assistant Examiner—Alan Mathews
Attorney, Agent, or Firm—Senniger, Powers, Leavitt and Roedel

[57] ABSTRACT

Apparatus for processing exposed lithographic plates in which an exposed plate is continuously fed forward with the exposed face of the plate facing up, developer is delivered onto the upper face of the plate by a nozzle which is traversed back and forth laterally with respect to the path of the plate above the plate to distribute the developer across the upper face of the plate, the developer is rubbed over the upper face of the plate, the plate is sprayed with water, preservative is delivered onto the upper face of the plate by a nozzle which is traversed back and forth along with the developer delivery nozzle to distribute the preservative across the upper face of the plate, and the preservative is rubbed over the upper face of the plate. The plate is fed forward by sets of plate feed rolls. Water is delivered onto certain of these rolls by nozzles which are traversed back and forth along with the developer and preservative delivery nozzles. Developer and preservative are pumped continuously to the respective nozzles from respective supplies, and developer and preservative not delivered onto a plate are collected and returned to the respective supplies. Water used in processing the plates may be filtered and recirculated, and make-up water added as needed.

33 Claims, 10 Drawing Figures

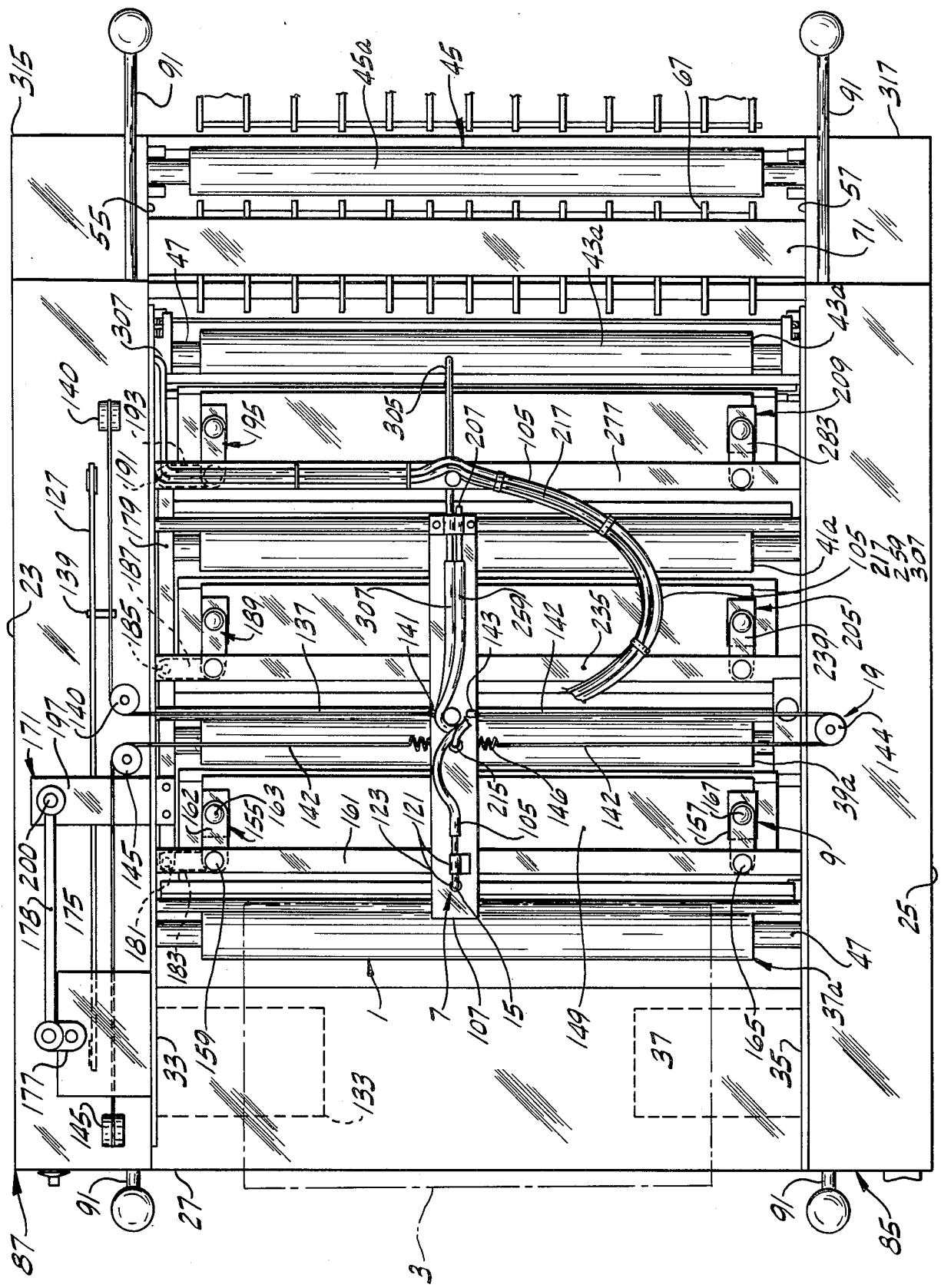

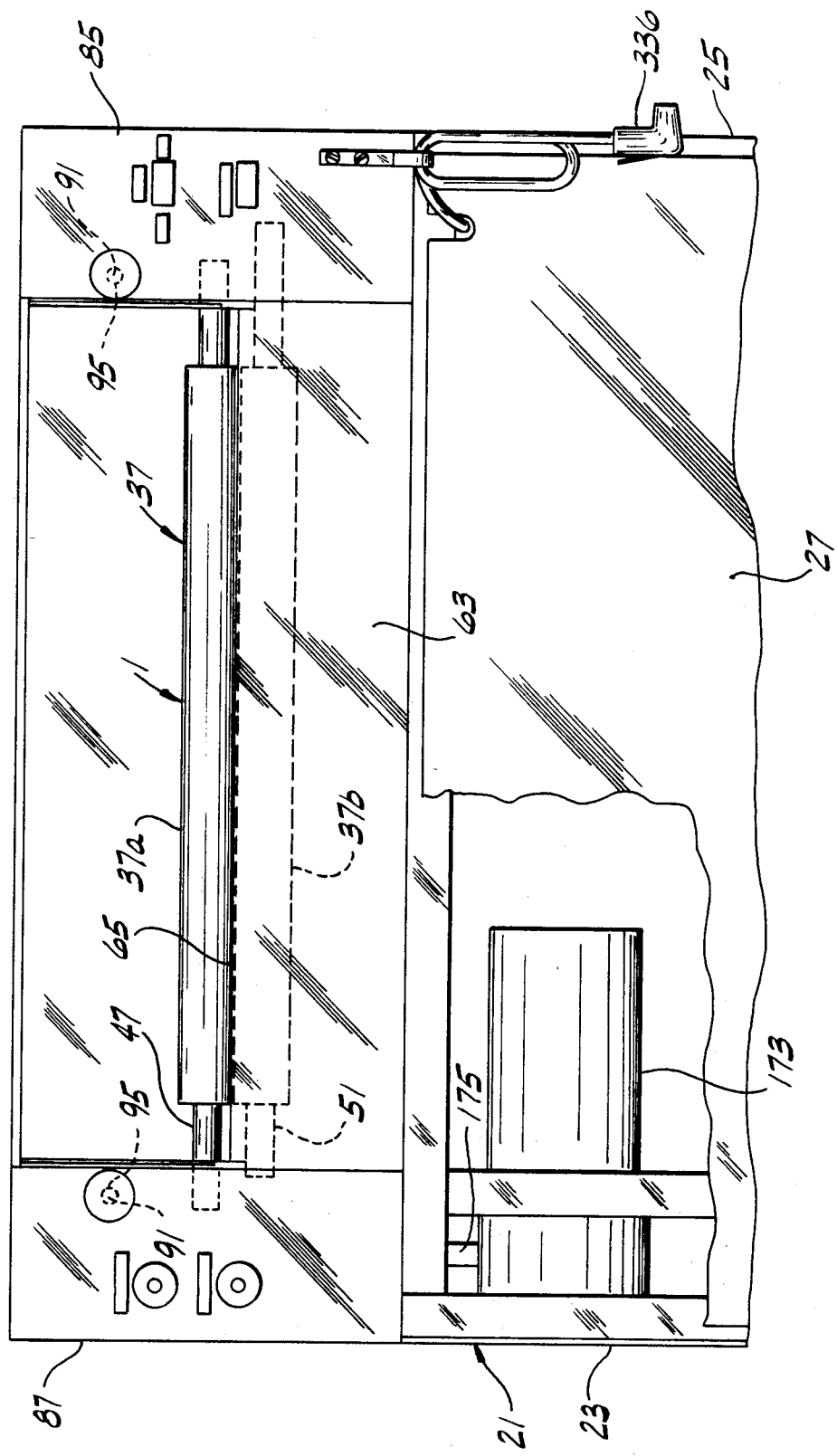

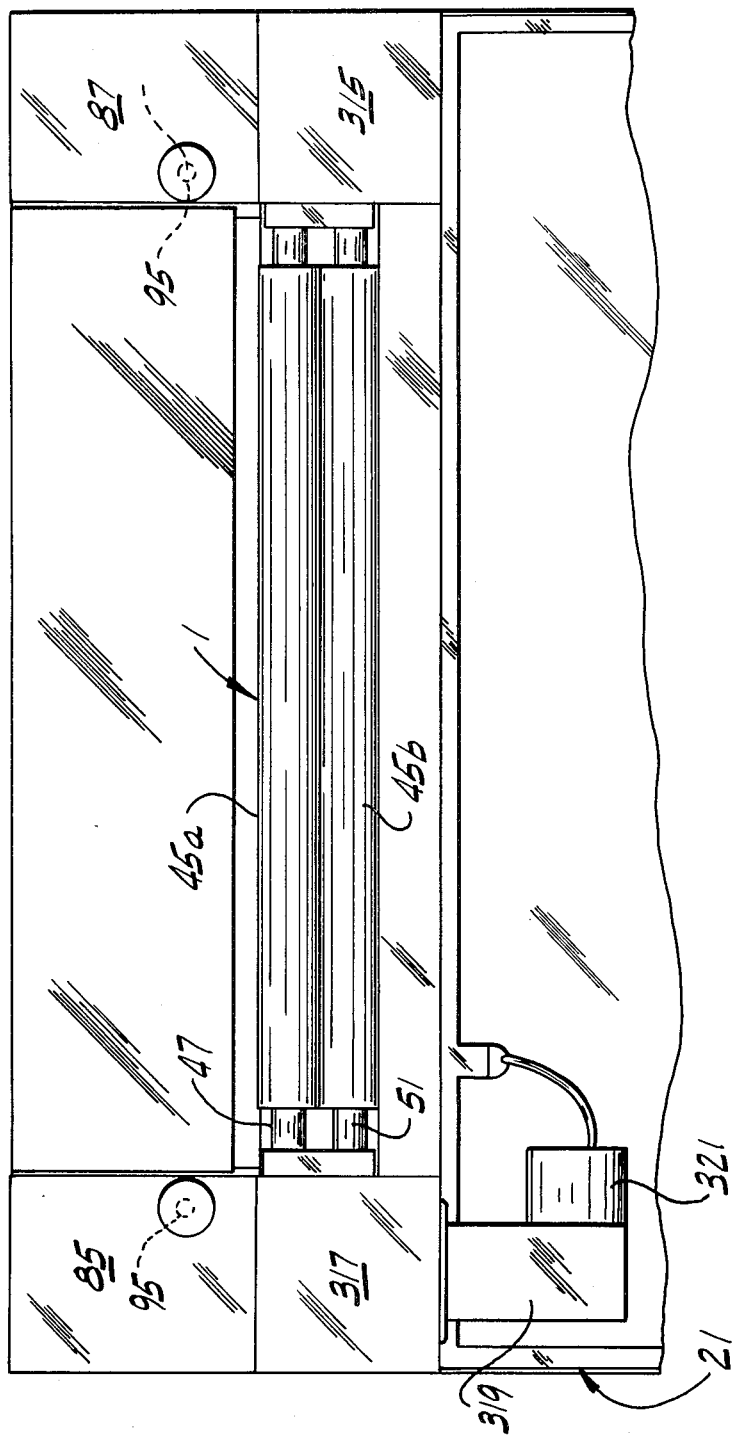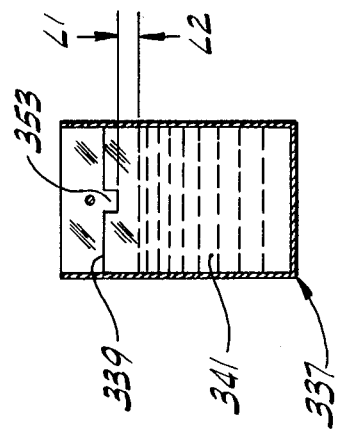

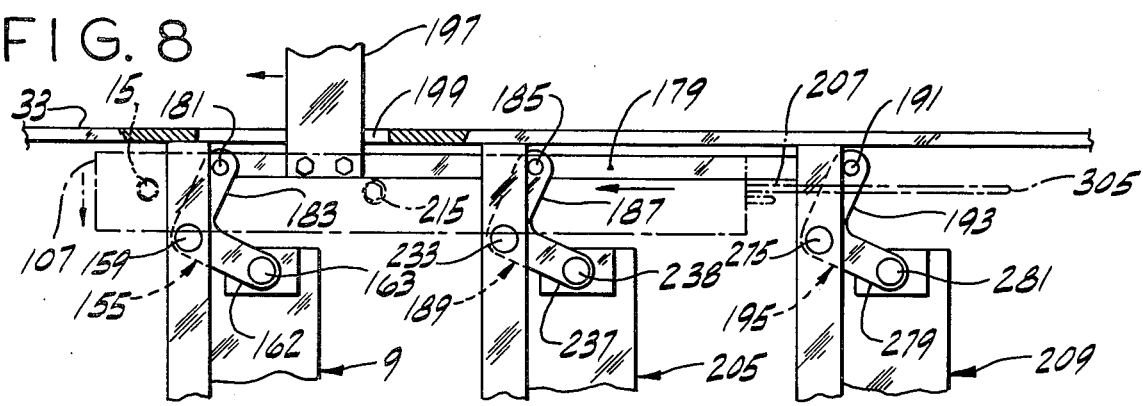
FIG. 8
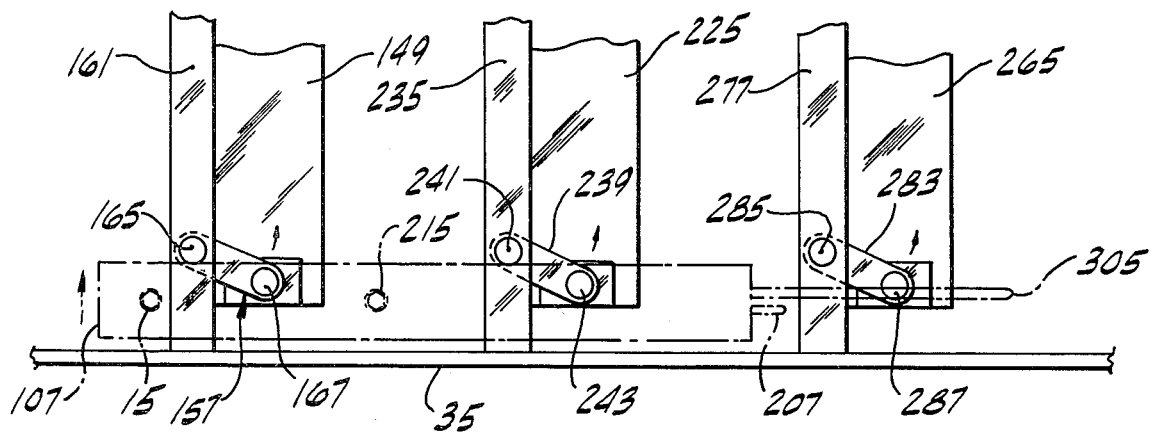
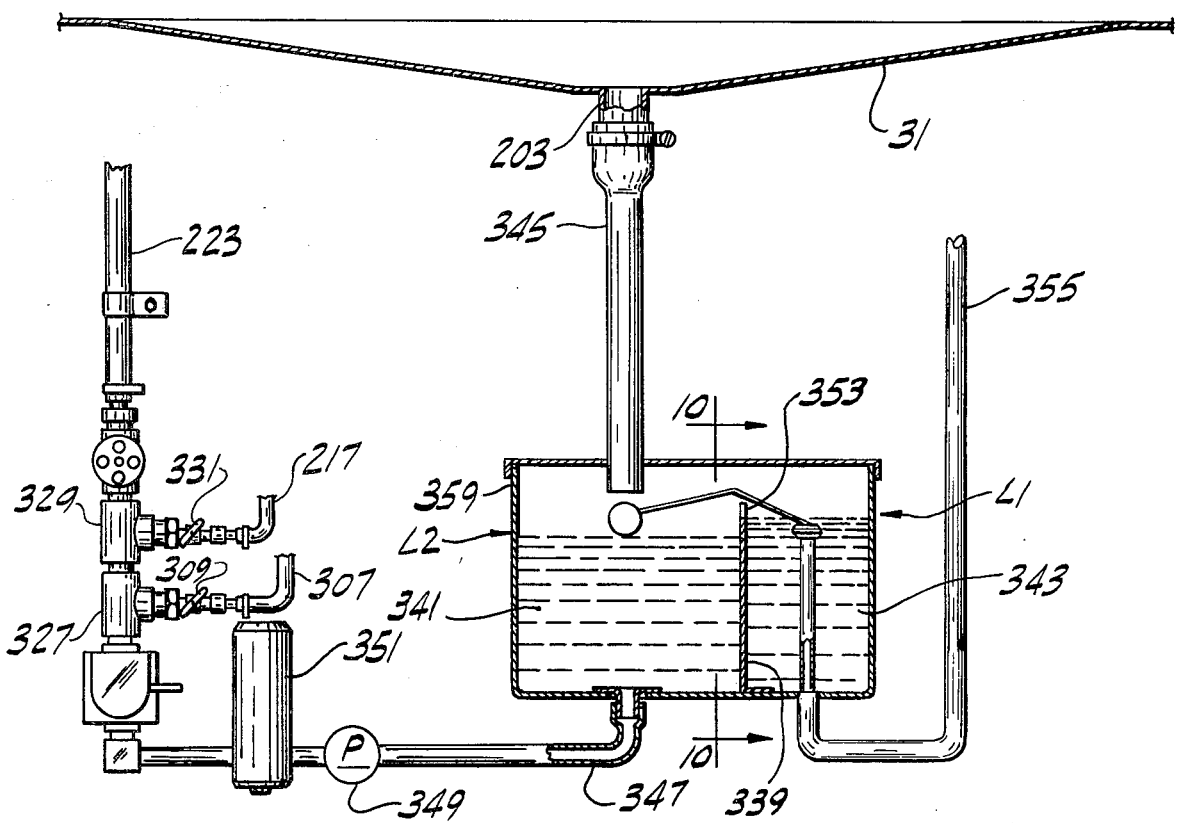
FIG. 9

APPARATUS AND METHOD FOR PROCESSING EXPOSED LITHOGRAPHIC PLATES

BACKGROUND OF THE INVENTION

This invention relates to apparatus for processing exposed lithographic plates, and more particularly to such apparatus for developing exposed lithographic plates and applying a preservative to the surface of the developed plates.

The invention may be regarded as involving improvements upon prior apparatus for processing exposed lithographic plates such as shown in the co-assigned U.S. Pat. Nos. 3,682,078 and 3,608,464 and 3,782,532, each showing apparatus particularly for processing lithographic plates of the type known in the art as additive plates. These plates have a photosensitive coating on one face thereof, the coating being a diazo compound which is adapted to be imaged by exposure through a film negative to an ultraviolet light source. Areas struck by light become oleophilic and insoluble in most solvents and aqueous solutions. Unexposed areas remain soluble in an acid aqueous solution. The plates are developed by application of a developer which is an oil and water emulsion. The oil phase of the developer generally contains a resin such as an epoxy or vinyl resin. The water phase generally contains gum arabic, a synthetic gum or a starch combined with certain acids. The developer is acid, abrasive and viscous. When it is dispersed over the exposed plate, the acid water phase dissolves the unexposed diazo. For best results, it is necessary to rub the developer over the entire plate surface with light pressure by means of a cellulose sponge or a brush. As the developer is rubbed over the surface, the gum combines with the dissolved diazo to form a desensitizer rendering the non-image areas (the areas not struck by light) hydrophilic. The resin phase is deposited on the exposed image of the plate and hardens by solvent evaporation. The rubbing must be carried out for a sufficient time to deposit a dense uniform resin film so that a visual evaluation of the developing operation may be made, and the resin is pigmented for this purpose. The used material must then be flushed by water from the plate surface and not reused since the solvent balance has changed; the redissolved diazo, having altered the pH value, would cause congealing of the resin phase if returned to the developer supply.

While the prior plate processors shown in said U.S. Pat. Nos. 3,608,464 and 3,782,532 have been generally satisfactory, they involve distribution systems for the developer which are of relatively high initial cost and which involve relatively high-cost maintenance to maintain an even and uniform flow of developer. Thus, they have involved a developer distribution system comprising multiple orifices for delivering the developer, each fed by a pump, or fed from a manifold supplied by a single pump. If too little developer is applied, the plates may be improperly desensitized and insufficient resin may be deposited, causing short press life for the plates and difficulty in trapping the printing ink. If too much developer is applied, solvent may not evaporate sufficiently, and this results in short plate life. Uneven distribution may cause all the above, and wastes developer, and with environmental problems it is desirable to minimize discharge of spent developer. While the plate processor shown in said U.S. Pat. No. 3,682,078 has been quite satisfactory, it has left a need for a simpler and more economical processor.

In other prior plate processors, the plates have been fed forward for processing by feed rolls, including an upper and lower roll immediately downstream from the developer rubbing station. It is desirable continuously to wash this upper roll with water, but difficulty has been encountered in washing it with water sprays as this may result in water traveling back on the upper surface of the plates toward the developer rubbing station and diluting the developer, causing improper and incomplete development.

In the plate processors shown in said U.S. Pat. Nos. 3,682,078 and 3,608,464 and 3,782,532, and in other prior plate processors, a preservative (such as an asphaltum, gum and etch composition sold by the assignee of this invention under its trademark A.G.E.) is applied to the developed plate to seal it. In such apparatus having an upper exit roll engaging the upper face of the plate at the exit end of the processor, there has been a problem of the preservative drying and glazing on this roll. This may undesirably cause ridging of the plate, which in turn causes what is called "gum blinding" in the printing press.

Other problems attendant upon use of plate processors of the class described are waste of developer and preservative, and disposition of spent developer washed off the plates in the processor without causing pollution of the environment.

SUMMARY OF THE INVENTION

Among the several objects of this invention may be noted the provision of an improved apparatus for processing lithographic plates which, while being of relatively simple and economical construction, is adapted to effect generally uniform distribution of developer across a plate as the plate is fed through the processor, for high quality of the plate with respect to both the ability of the plate to effect high quality printing and the so-called press life of the plate; the provision of such apparatus which reduces maintenance required to maintain an even and uniform flow of developer for application of neither too little nor too much developer to a plate and for uniform distribution of the developer onto the plate, thereby to provide properly desensitized, high quality plates (having a long press life and capable of high quality printing), without waste of developer, and reducing the amount of spent developer that needs to be discharged so as to reduce pollution problems; the provision of such apparatus adapted effectively continuously to wash the upper plate feed roll downstream from the developer rubbing station without diluting developer on the plate being developed; the provision of such apparatus adapted to effect generally uniform distribution of preservative across a developed plate as the developed plate is fed forward through the processor, with reduction of maintenance required to maintain an even and uniform flow of preservative, without waste of preservative; and the provision of such apparatus adapted to avoid glazing of preservative on the upper exit roll.

In general, apparatus of this invention comprises means for continuously feeding an exposed plate along a predetermined path with the exposed sensitized face of the plate facing up, means for delivering a developer for the plate onto the upper face of the plate with the developer distributed across the upper face of the plate, and means downstream from said developer delivery means for rubbing the developer over the upper face of the plate. The developer rubbing means comprises a rubbing member extending generally across the width of a plate being fed forward thereunder and means for moving said rubbing member at least laterally back and forth relative to said path to rub in the developer. The means for delivering the developer onto the upper face of the plate for being rubbed over the upper face of the plate comprises nozzle means for delivering developer onto the upper face of the plate as the plate is fed forward by said feeding means, means mounting the nozzle means for movement laterally of said path, and means for moving the nozzle means laterally of said path back and forth over the plate, with the nozzle means and its range of movement such that it applies developer generally throughout the width of the plate.

Other objects and features of the invention will be in part apparent and in part pointed out hereinafter.

BRIEF DESCRIPTION OF THE DRAWINGS

FIG. 1 is a plan (top view) of an apparatus of this invention;

FIG. 2 is a view in elevation, with parts broken away, of one end of the apparatus, which may be termed its entrance end, which is its end viewed from the left of FIG. 1;

FIG. 3 is a view in elevation, with parts broken away, of the other end of the apparatus, which may be termed its exit end, which is its end viewed from the right of FIG. 1;

FIG. 8 is a plan, with parts broken away, showing certain rubbing members of the apparatus and part of the drive means therefor, the rubbing members being shown in a moved position with respect to FIG. 1;

FIG. 9 is a view with parts broken away and shown in section showing a water recirculation system which may be used in conjunction with the apparatus, and which is adapted to add make-up water as required; and FIG. 10 is a vertical section on line 10—10 of FIG. 9.

Corresponding reference characters indicate corresponding parts throughout the several views of the drawings.

DESCRIPTION OF THE PREFERRED EMBODIMENT

Figure 4:
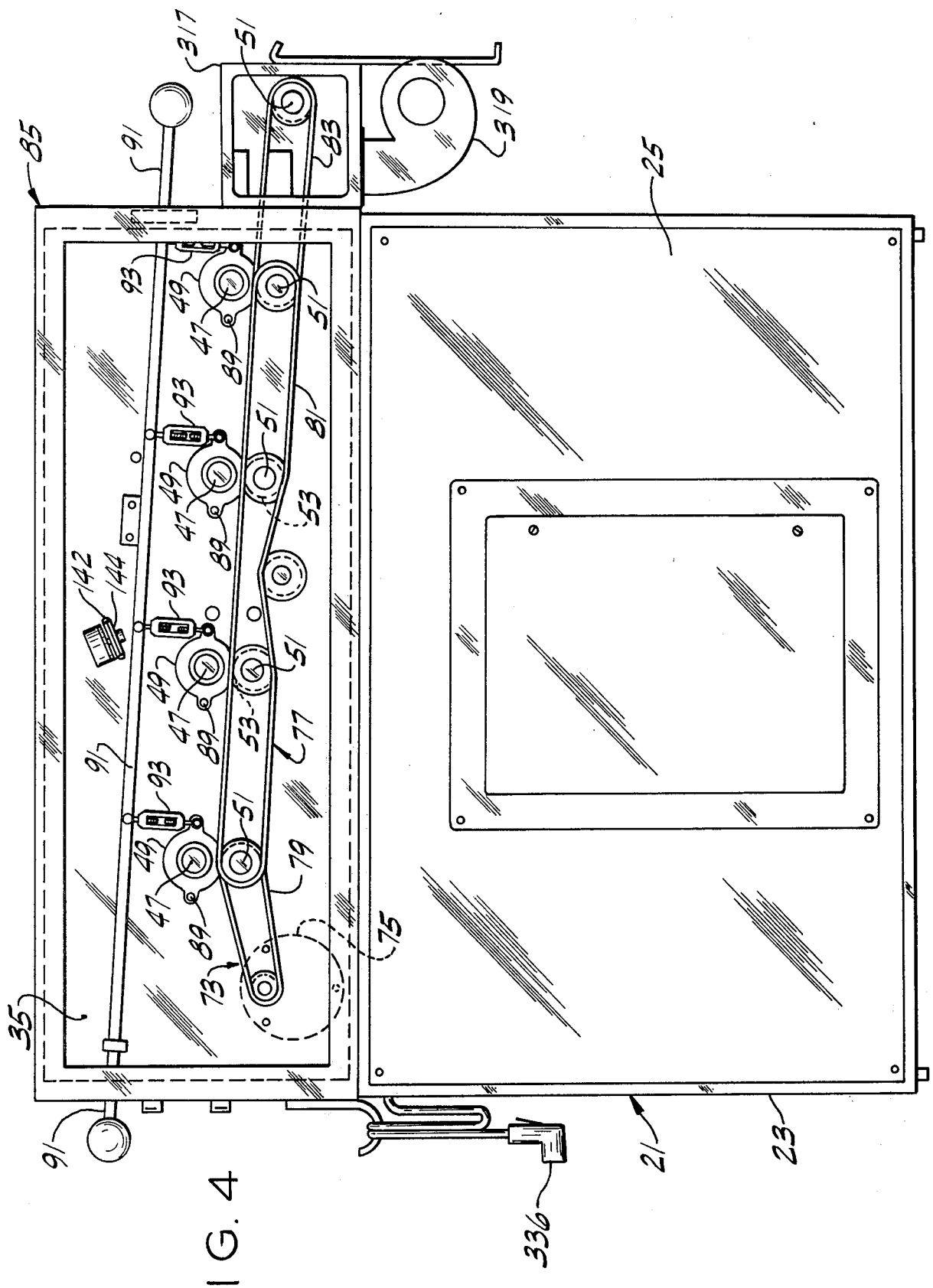
FIG. 4 is a view in elevation, with parts broken away, of that side of the apparatus which is at the right of the apparatus (as viewed from the entrance end of the apparatus)

Referring to the drawings, apparatus of this invention for processing exposed lithographic plates is shown basically to comprise means indicated generally at 1 for continuously feeding an exposed lithographic plate 3 along a predetermined path with the exposed sensitized face 5 (see FIG. 6) of the plate facing up. It will be understood that this face bears a photosensitive diazo coating, such as above mentioned, which has been exposed to ultraviolet light through a film negative or other imaging means of the matter which the plate is to print. The coating is therefore in condition for being developed to cause the areas of the plate which were struck by light through the negative to become oleophilic and insoluble with regard to the developer ultimately to be used, the unstruck area remaining as they were (soluble in the developer).

Means indicated generally at 7 is provided operable in a first zone A along the path of travel of the plates and above said path for delivering a developer for the plate (such as an oil and water emulsion as above mentioned) onto the upper face of the plate with the developer distributed across the upper face of the plate, as will appear.

Means indicated generally at 9 is provided at a second zone B downstream from the developer delivery means along the path of travel of the plates for rubbing the developer over the upper face of the plate. This means generally comprises a rubbing member 11, preferably a sponge, such as a cellulose sponge, extending generally across the width of a plate being fed forward thereunder, and means 13 for moving this rubbing member at least laterally, and preferably both laterally and longitudinally, back and forth relative to the horizontal path of travel of the plate to rub in the developer delivered to the plate and distributed across its upper face by the aforesaid means 7.

In accordance with this invention, the means 7 for applying the developer to the upper face of the plate comprises a nozzle 15 for delivering developer onto the upper face of a plate as the plate is fed forward by the plate feeding means 1, means 17 mounting the nozzle means for movement laterally of the horizontal path of the plates, and means 19 for moving the nozzle means laterally of said path back and forth over the plate with the nozzle means and its range of movement back and forth over the plate such that the nozzle means applies the developer generally throughout the width of the plate.

In detail, the apparatus comprises a base structure in the form of a cabinet 21 having sides 23 and 25, ends 27 and 29 and a top 31 formed as a drain pan. The end 27 may be referred to as the entrance or upstream end and the other end 29 as the exit or downstream end, with relation to the direction of feed of the plates to be processed. Side 23 may be referred to as the left side, and side 25 as the right side, as viewed in downstream direction. Extending up from the top 31 of the cabinet adjacent the opposite sides of the cabinet, and spaced inward from the sides of the cabinet are left and right side frame plates 33 and 35. The means 1 for feeding the exposed lithographic plates 3 forward comprises a series of sets of horizontal plate feeding rolls, there being five such sets, designated 37, 39, 41, 43 and 45. Each of the first four sets comprises an upper roll designated by the subscript a and a lower roll designated by the subscript b, these rolls extending horizontally across the apparatus from adjacent the left-hand side plate 33 to adjacent the right-hand side plate 35, each upper roll having a shaft 47 extending through openings in plates 33 and 35 and journalled in bearings indicated at 49 on the outside of plates 33 and 35. These bearings are movable up and down in a manner to be described. Each of the lower rolls of the first four sets has a shaft 51 extending through openings in the plates 33 and 35 and journalled in bearings indicated at 53 fixed on the outside of these plates. The fifth set 45 of rolls, which is the last set of the series (and thus constitutes the outfeed or exit set of rolls) comprises an upper roll 45a and a lower roll 45b extending horizontally across the apparatus between forward extensions at 55 and 57 of the side frame plates 33 and 35. Rolls 45a and 45b have shafts also designated 47 and 51 extending through openings in the plate extensions and journalled in fixed bearings on the outside of the latter.

The five sets of feed rolls 37, 39, 41, 43 and 45 are arranged with their pass planes coplanar in a plane which may be inclined downwardly slightly off horizontal in downstream direction above the pan 31 at the top of the cabinet 21, and with the successive sets of the series spaced at intervals less than the dimension of a lithographic plate 3 in the direction of feed (according to the way the plates are fed through the apparatus) so that a plate 3 enters the nip of each successive set of rolls before it exits from the preceding set in order to feed the plate entirely through the apparatus. At 63 is indicated a housing which extends across the top of the cabinet at its entry end. A plate 3 to be fed through the apparatus is slid over the top 65 of this housing into the nip of the first (upstream) set 37 of plate feed rolls, and is fed forward by this set to the next set 39, and so on. The plate issuing from the fourth set 43 of plate feed rolls passes over an air grille 67 (which may be made of wire) on an upwardly opening channel 69 for air for plate drying purposes as will appear, and under a downwardly opening air channel 71 and thence to the final set 45 of plate feed rolls.

Means indicated generally at 73 (see particularly FIG. 4) is provided for driving the plate feed rolls, this means comprising a motor/adjustable speed unit 75 mounted on top of the cabinet adjacent the entrance end of the apparatus at the right driving the lower rolls b of the five sets 37, 39, 41, 43 and 45 of plate feed rolls via belt and pulley drive means as indicated at 77 on the outside of side plate 35, this belt and pulley drive means comprising three separate belts 79, 81 and 83. A cover or housing for the drive means 77 is indicated at 85. A similar cover or housing designated 87 is provided at the opposite side of the apparatus to enclose mechanism on the outside of plate 33.

The bearings 49 for the shafts 47 of the upper rolls a of the first four sets 37, 39, 41 and 43 of plate feed rolls are pivoted as indicated at 89 on the outside of plates 33 and 35 for swinging movement about horizontal axes for up and down movement of the bearings (as previously mentioned) and the upper rolls a of the first four sets. Two rods, each designated 91, are provided for raising and lowering the bearings 49 and hence the rolls a of the first four sets, these rods extending alongside the plates 33 and 35 on the outside of the plates and being connected to the bearings by adjustable links 93, the latter being shown as turnbuckles. The rods 91 are axially slidable in holes 95 in the ends of the covers 85 and 87 between a first position for lowering the upper rolls a of the first four sets into engagement with the lower rolls b of the first four sets for the feeding of the plates 3, and a second position for raising the upper rolls out of engagement with the lower rolls when the apparatus is not in use so as to avoid flattening the rolls. The links (turnbuckles) 93 are adjustble for varying the pressure of the feed rolls on the plates 3 as they are fed foward by the feed rolls.

Figure 5:
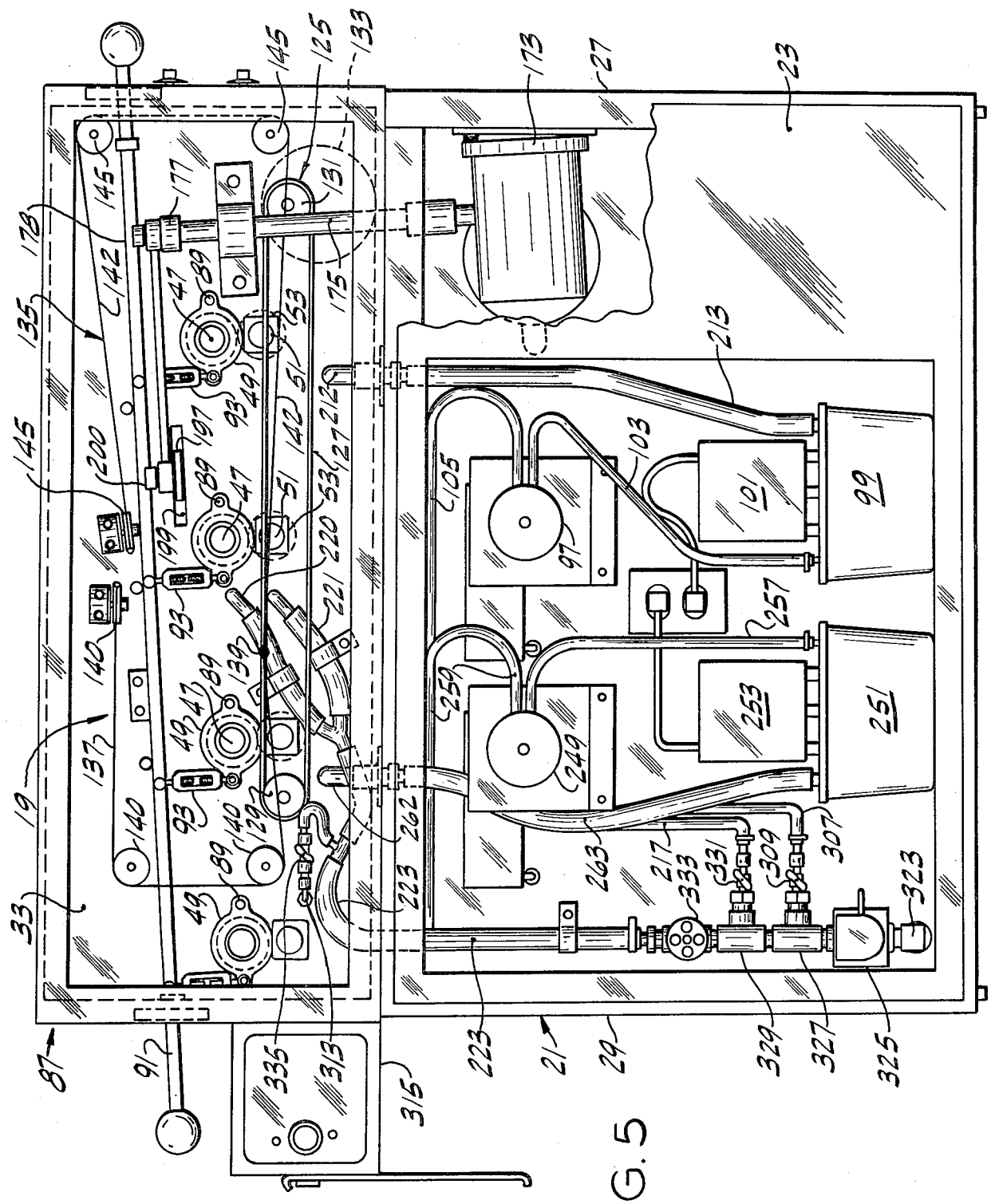
FIG. 5 is a view in elevation, with parts broken away, of the other side of the apparatus.

The means 7 for delivering developer on to the upper surface of a plate 3 is operable in zone A immediately downstream from the first set 37 of plate feed rolls, and the means 9 for rubbing the developer over the upper face of the plate is operable in zone B immediately downstream from zone A, i.e., between zone A and the second set 39 of feed rolls, so that the developer is rubbed over the face of the plate 3 before the plate reaches the second set 39 of plate feed rolls. The nozzle means 15, as herein illustrated, comprises a single nozzle, which may simply be a tube with about a one-eighth inch internal diameter. It is supplied with developer via a pump 97 (FIG. 5) from a reservoir 99 housed in the cabinet 21 holding a supply of developer. Developer in the reservoir 99 is maintained mixed by suitable mixing means (not shown) in the reservoir driven by a mixer motor 101 on top of the reservoir. Developer feeds from the reservoir to the inlet of pump 97 via a line 103 (e.g., a hose), and is delivered to the delivery nozzle or tube 15 via a flexible hose line 105. The nozzle or tube 15 is carried by a carriage 107 constituting an element of the means 17 mounting the nozzle or tube 15 for movement laterally of the horizontal path of the plates 3. The flexible hose 105 flexes as the nozzle 15 moves from side to side with the carriage 107. This carriage 107 is constituted by an elongate relatively narrow bar extending longitudinally of the apparatus from a point above the first set of rolls 37 to a point above and slightly downstream from the third set of rolls 41. The carriage or bar 107 is guided for reciprocation back and forth transversely of the apparatus by means of a slide guide 109 secured to the bottom of the carriage generally midway of its length, this guide being slidable on a guide rod 111 extending transversely of the apparatus between the side frame plates 33 and 35 above the second set of feed rolls 39. The carriage has pads 113 and 115 secured to its bottom at its ends slidable on rods 117 and 119 extending transversely of the apparatus between the side frame plates for preventing tilting of the carriage. The tube 15 is secured to the carriage as indicated at 121 and extends down through a hole at 123 in the carriage adjacent the upstream end of the carriage, with its lower end just slightly above the plane of the path of feed of the plate 3.

The carriage is slidable on the rods 117, 111 and 119 transversely of the apparatus back and forth through a stroke from adjacent one of the side frame plates 33, 35 to adjacent the other, thereby to reciprocate the tube 15 through a stroke corresponding generally to the width of the widest plate which is to be fed through the apparatus. Thus, assuming the widest plate 3 which is to be fed through the apparatus is twenty-five inches wide, the carriage 107 and tube 15 will be reciprocated through a stroke of generally twenty-five inches, thereby to move the tube through a stroke corresponding generally to the width of the plate 3 passing under the tube, both as to dimension of the plate and the location of the plate transversely of the apparatus.

The means 19 is adapted to reciprocate the carriage through the stated stroke, thereby to move the tube 15 back and forth over the plate. As the tube moves back and forth, developer issues therefrom in a narrow stream (e.g., a one-eighth inch diameter stream). The stream has a range of movement (e.g., twenty-five inches) such that the developer is applied generally throughout the width of the plate. Means 19 comprises an endless conveyor means indicated generally at 125 in FIG. 5 on the outside of the side frame plate 33 in the housing 87, this conveyor means comprising an endless chain 127 trained around sprockets 129 and 131 driven by a combination motor and speed reducer unit 133. The latter is adapted to drive the chain 127 continuously in one direction. The chain is connected to the carriage 107 by a cable system 135 comprising a cable 137 connected at 139 to the chain, trained around a series of pulleys 140 on the outside of the side plate 33 and extending through a hole in side plate 33 to a connection at 141 with the left side of the carriage 107, and a cable 142 connected at 143 to the carriage 107 extending through a hole in the side plate 35, around a pulley 144 on the outside of side plate 35, back through a hole in the plate 35, across the apparatus underneath the carriage 107, through a hole in the side plate 33 and around a series of pulleys 145 to the connection at 139 to the chain 127. Cable 142 has means such as a tension spring section 146 for maintaining it taut. The arrangement is such that as the connection 139 travels toward the right with the upper reach of the chain as viewed in FIG. 5, cable 137 pulls the carriage 107 toward the left side of the apparatus, and as the connection 139 travels toward the left with the lower reach of the chain as viewed in FIG. 5, cable 142 pulls the carriage toward the right side of the apparatus.

Developer delivered onto the upper face 5 of plate 3 by means 7, and distributed thereby across the plate, is rubbed over the upper face of the plate by means 9 as the plate travels through zone B. This rubbing means 9 comprises an elongate flat bar 149 extending transversely of the apparatus carrying the sponge 11 on its bottom, the means 13 acting to oscillate the sponge over the upper face of the plate 3 with the plate backed by a platen 151 on a platen support 153 which extends transversely of the apparatus between the side frame plates 33 and 35. The platen 151 is spaced forward of (downstream from) zone A in which the nozzle or tube 15 operates. The means 13 for moving the bar 149 with the sponge 11 on its bottom comprises a pair of cranks 155 and 157. Crank 155 is a bell crank pivoted at 159 on the bottom of a crossbar 161 extending between the side frame plates 33 and 35 between zones A and B (and underneath the carriage 107) adjacent and on the inside of the side frame plate 33, having an arm 162 pin-connected at 163 to the sponge bar 149. Crank 157 is a simple link pivoted at 165 on the bottom of bar 161 adjacent and on the inside of side farme plate 35 and pin-connected at 167 to the sponge bar 149. The pins at 163 and 167 are vertically slidable in holes in the arm 162 and crank 157 and the sponge bar 149 is biased downwardly for pressurized engagement of sponge 11 with a plate 3 by coil compression springs 169 on the pins reacting down from the arm 161 and crank 157 against the sponge bar. The springs may be changed for adjusting the pressure, and the pins may be made removable from the sponge bar for replacing it (with its sponge) in suitable manner. The cranks 155 and 157 are adapted to be oscillated by a drive 171 comprising a motor and speed reducer unit 173 (see FIG. 5) mounted in the cabinet 21 having its output shaft 175 extending up into the housing 87. A crank 177 on the upper end of the shaft 175 is connected by a link 178 to a bar 179 extending longitudinally of the apparatus adjacent and on the inside of side frame plate 33, this bar 179 being pinned at its upstream end as indicated at 181 to arm 183 of bell crank 155, pinned intermediate its ends as indicated at 185 to an arm 187 of a bell crank 189, and pinned at its downstream end as indicated at 191 to arm 193 of another bell crank 195. Bar 179 has a tongue 197 extending laterally outward through a slot 199 in side plate 33, and link 178 is pivoted at 200 to this tongue, the arrangement being such that with shaft 175 driven by unit 173, crank 177 acts via the link 178 to move the bar 179 back and forth generally longitudinally of the apparatus (with some orbital motion), and bar 179 swings bell crank 155 on its pivot 159 with resultant movement of rubbing member 9 (sponge bar 149 and sponge 11) laterally and longitudinally of the apparatus above the platen 151, as determined by the arc of oscillation of the bell crank 155.

As noted above, developer is delivered on to the upper face of a plate 3 as the plate is fed forward through the first zone A, and the developer is rubbed over the upper face of the plate as the plate moves through the second zone B. Means indicated generally at 201 is provided operable in a third zone C along the path of travel of the plates 3 for spraying water on to the upper face of a plate to wash off excess developer therefrom, and also on to the bottom face of a plate for washing the bottom. The wash water collects in the pan 31 constituting the top of the cabinet 21, this pan having a drain 203 for draining off the water. Means indicated generally at 205 is operable in a fourth zone D along said path for scrubbing (preferably brushing) the wetted upper face of the plate for removing any remaining developer. Means indicated generally at 207 is operable in a fifth zone E along said path for delivering a preservative (e.g., the aforementioned asphaltum, gum and etch composition) on to the upper face of the plate with the preservative distributed across the upper face of the plate. Means indicated generally at 209 is operable in a sixth zone F along said path for rubbing the preservative over the upper face of the plate. The aforementioned plate drying means 69, 71 is in a seventh zone G along said path. The first set of rolls 37 is upstream of the first zone A. The second set of rolls 39 is between zones B and C. The third set of rolls 41 is between zones D and E. The fourth set of rolls 43 is between zones F and G, and the fifth set of rolls 45 is downstream of zone G.

In the operation of the apparatus, the developer pump 97 is operated continuously to deliver developer from the reservoir 99 through the hose line 105 to the developer nozzle 15, which is continuously traversing back and forth transversely of the apparatus in zone A. In intervals between passage of a plate 3 through zone A (i.e., during intervals when there is no plate under the lower end of the nozzle 15 to receive developer), the stream of developer issuing from the nozzle passes down in zone A (between the set of rolls 37 and the rubbing means 9) and is caught in a collecting means 211 constituted by a drain trough extending from one side of the cabinet to the other, inclined downwardly from side 35 to side 33 for gravity flow of developer caught in the trough to an elbow 212 in side 33 and thence through a drain hose 213 to the developer reservoir 99.

As a developed plate 3 exits from the rubbing means 9 in zone B and passes between the rolls 39a and 39b of the second set 39 of rolls, the resin on the upper face of the plate is still soft and subject to "skidding" on account of contact with roll 39a. Also, there is a tendency for a pool of resin to build up on the upper face of the plate as the plate is being fed through the apparatus, which tends to cause redissolving of the resin in the solvents that are present. To alleviate these problems, the top roller 39a of set 39 is continuously washed with water thereby continuously to dilute the build-up of developer on the upper face of a plate upstream of the nip of rolls 39a and 39b, and to set the resin (thereby to avoid "skidding"). For this purpose means 215 comprising a nozzle means for delivering water onto the upper roll 39a is provided, this nozzle means being constituted by a single nozzle carried by the carriage 107 and thereby movable from adjacent one end of the upper roll to adjacent its other end along with the developer nozzle 15 as the carriage moves laterally back and forth. Water is delivered to the water nozzle 215 from a suitable water supply via a flexible water hose 217, which flexes as the nozzle 215 moves from end to end of roll 39a.

Figure 7:
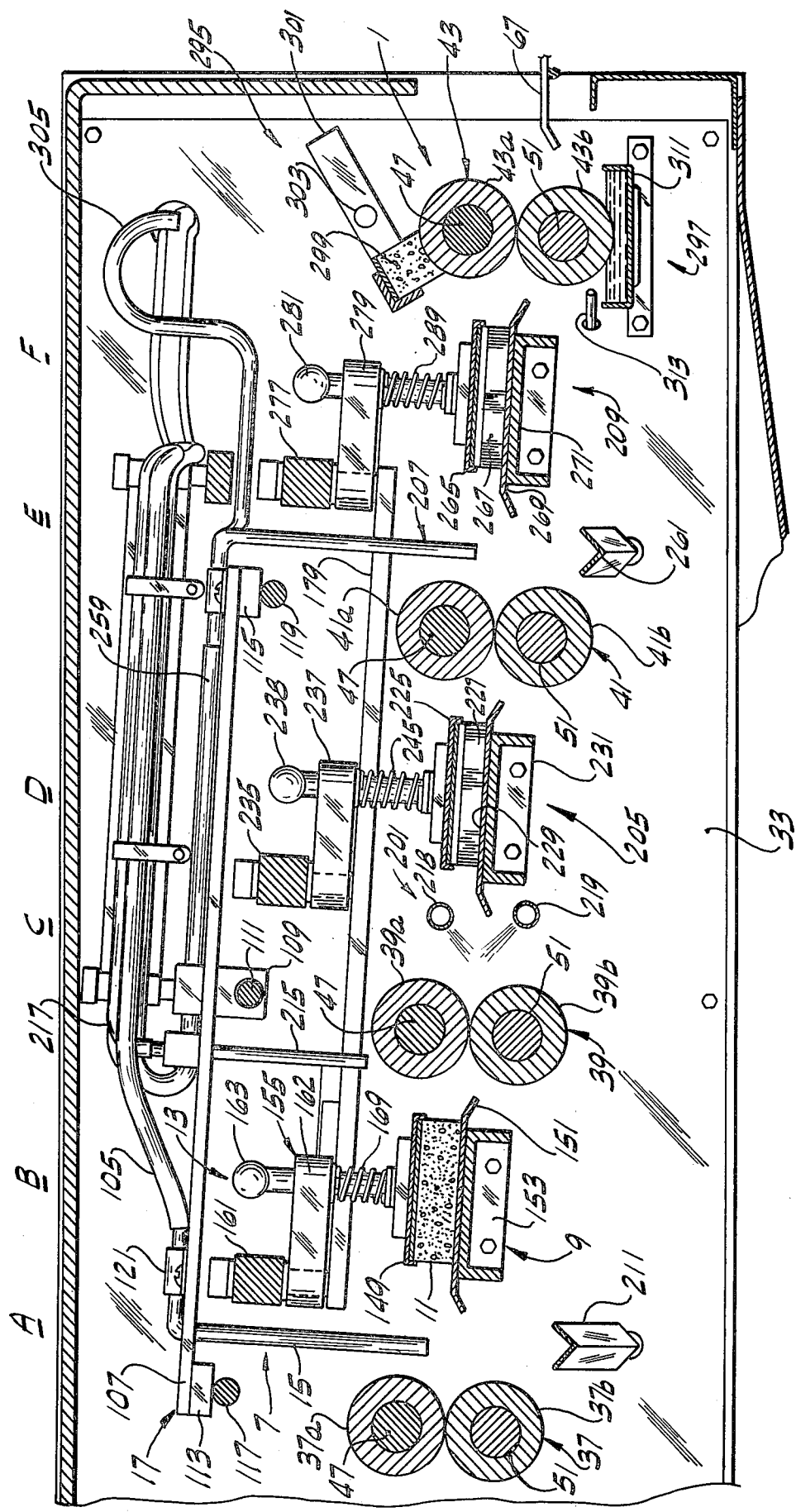
FIG. 7 is an enlarged fragment of FIG. 6.

The spray means 201 in zone C comprises an upper spray pipe 218 for spraying water downwardly and rearwardly on the upper face 5 of a plate 3 and a lower spray pipe 219 for spraying water upwardly and rearwardly on the bottom face of the plate as the plate feeds forward from the set of rolls 39. Each pipe extends between the side frame plates 33 and 35 and has spray holes for directing streams of water as indicated in FIG. 7. The pipes are supplied with water via lines 220 and 221 branched off from a water supply line 223.

The scrubbing means 205 comprises an elongate flat bar 225 extending transversely of the apparatus carrying a brush 227 on its bottom. The bar 225 carrying the brush is oscillated along with and in the same manner as the rubbing means 9 by the bar 179, the brush being oscillable over the upper face of a plate 3 with the plate backed by a platen 229 on a platen support 231 extending transversely of the apparatus between the side frame plates 33 and 35. The aforementioned bell crank 189 is pivoted at 233 on the bottom of a crossbar 235 extending between the side plates 33 and 35. It has an arm 237 pin-connected at 238 to the brush bar 225. A link 239 is pin-connected at 241 on the bottom of the crossbar and is pin-connected at 243 to the brush bar. The pins at 238 and 243 are vertically slidable in the arm 237 and link 239 and biased downwardly for pressurized engagement of brush 227 with a plate 3 by coil compression springs 245. The springs may be changed for adjusting the pressure, and the pins may be made removable from the brush bar 225 for replacing it (with its brush) in suitable manner. Bar 179 is pinned at 185 to arm 187 of bell crank 189 for oscillating this bell crank and hence oscillating the bar 225 with its brush 227.

The means 207 for delivering the preservative to the upper face of a plate 3 in zone E comprises a nozzle means constituted by a single nozzle carried by the carriage 107 and thereby movable laterally of the path of a plate from adjacent one side of the plate to adjacent the other side of the plate, thereby to apply the preservative generally throughout the width of the plate. The nozzle 207, which may simply be a tube with about a one-eighth inch internal diameter, is supplied with preservative via a pump 249 from a reservoir 251 housed in the cabinet 21 holding a supply of preservative. Preservative in the reservoir 251 is maintained mixed by suitable mixing means (not shown) in the reservoir driven by a mixer motor 253 on top of the reservoir. Preservative feeds from the reservoir to the inlet of pump 249 via a line 257, and is delivered to the nozzle or tube 207 via a flexible hose line 259. The latter flexes as nozzle 207 moves from side to side with the carriage.

In the operation of the apparatus, the preservative pump 253 is operated continuously to deliver preservative from the reservoir 251 through the hose line 259 to the preservative nozzle 207, which is continuously traversing back and forth transversely of the apparatus in zone E. In intervals between passage of a plate through zone E (i.e., during intervals when there is no plate under the lower end of the nozzle 207 to receive preservative), the stream of preservative issuing from the nozzle 207 passes down in zone E and is caught in a collecting means 261 constituted by a drain trough extending from one side of the cabinet to the other, inclined downwardly from side 35 to side 33 for gravity flow of preservative caught in the trough to an elbow 262 in side 33 and thence through a drain hose 263 to the preservative reservoir 251.

The means 209 for rubbing the preservative over the upper face of a plate in zone F comprises an elongate flat bar 265 extending transversely of the apparatus carrying a brush 267 on its bottom. The bar 265 carrying the brush 267 is oscillated along with and in the same manner as means 9 and means 205 by the bar 179, the brush 267 being oscillable over the upper face of a plate 3 with the plate backed by a platen 269 on a platen support 271 extending transversely of the apparatus between the side frame plates 33 and 35. The aforementioned bell crank 195 is pivoted at 275 on the bottom of a cross bar 277 extending between the side plates 33 and 35. It has an arm 279 pin-connected at 281 to the brush bar 265. A link 283 is pin-connected at 285 on the bottom of the crossbar and is pin-connected at 287 to the brush bar. The pins at 281 and 287 are vertically slidable in the arm 279 and link 283 and biased downwardly for pressurized engagement of brush 267 with a plate 3 by coil compression springs 289. The springs may be changed for adjusting the pressure, and the pins may be made removable from the brush bar 265 for replacing it (with its brush) in suitable manner. Bar 179 is pinned at 191 to arm 193 of bell crank 195 for oscillating this bell crank and hence oscillating the bar 265 with its brush 267.

Means indicated generally at 295 is provided for removing preservative from the upper roll 43a and means indicated generally at 297 is provided for dampening the lower roll 43b of the fourth set of rolls 43 to prevent glazing of preservative on these rolls, thereby to avoid "ridging" on the plates 3 and "gum blinding" in the use of the plates in a printing press. The means 295 comprises a sponge 299 which extends across the top of the upper roll 43a generally throughout the length of the roll, and held in contact therewith by being mounted on a sponge holder 301 pivoted as indicated at 303 on the side frame plates 33 and 35 for downward swinging movement of the sponge into wiping engagement with the roll, the arrangement being such as to provide gravity biasing of the sponge into contact with the roll. Sponge-dampening nozzle means 305 carried by the carriage 107 delivers water to the sponge 299, the nozzle means 305 being constituted by a single nozzle moving with the carriage back and forth along the length of the sponge. The nozzle 305 is supplied with water via a flexible water hose 307, a suitable adjustable flow control valve means 309 such as a needle valve being provided to adjust the flow of the water to a rate such as to maintain the sponge only damp, without making it so wet as to cause dilution of the preservative (such as may result in plate oxidation). The dampening means 297 for the lower roll 43b comprises a pan 311 extending between the side frame plates 33 and 35 for holding water under the lower roll, and means indicated at 313 for dripping water into the pan at a rate to make up for water carried away by the lower roll, thereby to maintain water in the pan for wetting the lower roll.

The air channels 69 and 71 extend between housings 315 and 317 at the exit ends of covers 85 and 87. A blower 319 driven by an electric motor 321 blows air into the housing 315, from which the air exits via suitable openings into the respective ends of the channels and flows along the channels toward the housing 317 and out of the bottom of the top channel and the top of the bottom channel for drying the plates. The finished plates 3, exiting from the set of rolls 45, are suitably stacked.

The water supply line 223 may be connected as indicated at 323 to a suitable available water supply. It includes a solenoid valve 325 which opens when the apparatus is turned on and closes when the apparatus is turned off. Downstream from the solenoid valve is a tee 327 for connection of valve 309. Downstream from tee 327 is a second tee 329 for connection of line 217, with a needle valve 331 for controlling the rate of flow of water through line 217. Downstream from the second tee is a manual cut-off valve 333. Means 313 for dripping water into the pan 311 comprises a line branched off from line 223 and including a needle valve 335. The flexible hose lines 105 (for developer), 217 (for water), 259 (for preservative) and 307 (for water) are harnessed together as shown in FIG. 1 and formed into a loop which leads to the carriage 107, where the lines are separated and trained along the carriage to the respective nozzles. A hand sprayer is indicated at 336.

In certain circumstances, it may be satisfactory to connect line 223 to an outside source of water, and simply drain off the water with developer and preservative collecting in the drain pan 31 via the drain 203 to a place of disposal. However, for environmental protection purposes, the water with developer and preservative collecting in the drain pan 31 may be recirculated, with the addition of make-up water, by means of the recirculation system illustrated in FIGS. 9 and 10. As shown, this system comprises a tank 337 divided by a partition 339 into a first chamber 341 and a second chamber 343. Water from the nozzle 215, spray pipes 218 and 219 and nozzle 305 with developer and preservative collected in pan 31 drains via the drain 203 and a drain hose 345 connected to the first chamber 341 of the tank. A line 347 extending from chamber 341 to the line 223 having a pump 349 and a filter 351 therein is provided for pumping the water back for recirculation to the line 223, and thence to the nozzle 215, spray pipes 218 and 219 and nozzle 305.

The second chamber 343 is part of a means for adding make-up water to the water collected in the first chamber 341. The chamber 343 is adapted to overflow into the chamber 341 via a notch 353 in the top of the partition 339 when water in chamber 343 rises above a predetermined level L1, which is the level of the bottom of the notch 353. Water is delivered to chamber 343 from a suitable source by means 355, shown as a supply pipe extending up into chamber 343 from the bottom of the chamber having value 357 at its upper end, which delivery is controlled by a float 359 in chamber 341 on a valve-operating arm 361 extending from the valve over the partition 339 (above the notch 353) to chamber 341. The float is so positioned that valve 357 is opened when water is drawn down below a predetermined level L2 in chamber 341 (which is a lower level than L1) for delivery of water from the supply to the chamber 343, and closed when the water in chamber 341 rises to the level L2. Thus, chamber 343 is maintained filled with water to level L1. When water is lost from the system (by evaporation or otherwise) and the rate of delivery of water to the chamber 341 thereby becomes too low to maintain the water level L2 in chamber 341, the float 361 falls and opens the valve 357 for delivery of water to chamber 343, which overflows into chamber 341 to provide the water necessary to make up for the loss.

The valve in chamber 343 is isolated from water carrying waste material in chamber 341, and thus protected from the corrosive and abrasive effect of the waste material. This enables use of a simple mechanical float valve at 357.

Figure 6:
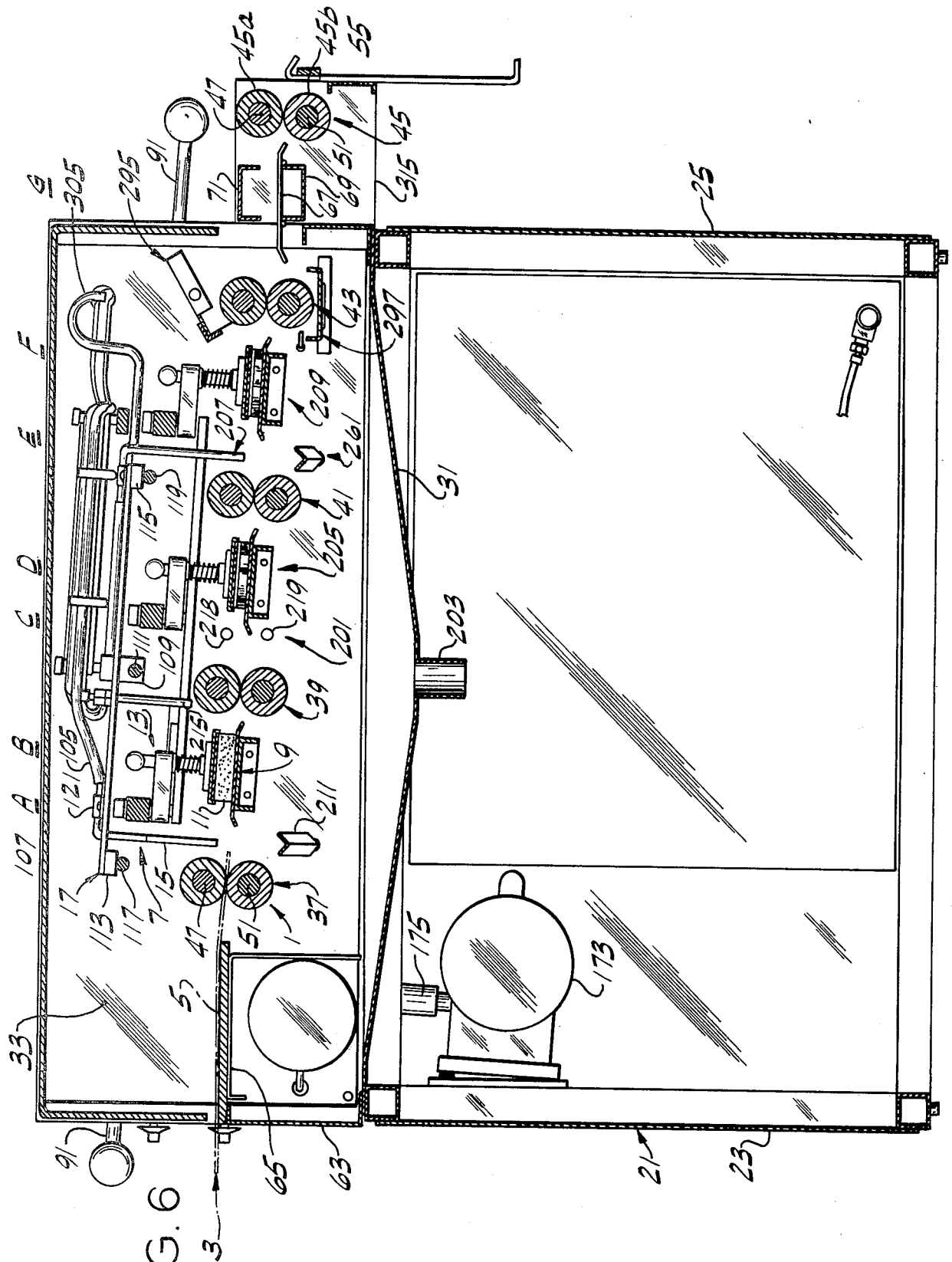
FIG. 6 is a longitudinal vertical section of the apparatus, with parts broken away, taken on line 6—6 of FIG. 1.

In the operation of the apparatus, the five sets of plate feed rolls 37, 39, 41, 43 and 45 are continuously driven in the direction of feed lithographic plates 3, exposed face 5 up, through the apparatus from left to right as viewed in FIGS. 1, 6 and 7. The carriage 107 is continuously reciprocated transversely of the path of the lithographic plates and above said path back and forth between the side frame plates 33 and 35 (see the two extreme lateral positions of the carriage illustrated in phantom in FIG. 8). As it reciprocates back and forth, it carries with it the developer delivery nozzle 15, the water delivery nozzle 215, the preservative delivery nozzle 207 and the water delivery nozzle 305. Thus, all these nozzles are traversed back and forth between the sides of the path of the plates. Pump 97 is operated continuously to deliver developer to nozzle 15. Pump 249 is operated continuously to deliver preservative to nozzle 207. Water is continuously supplied from line 223 to nozzle 215, spray pipes 218 and 219, nozzle 305, and line 313. The sponge 11 and brushes 277 and 267 are continuously driven, each having an orbital motion (laterally and longitudinally with respect to the path of the plates).

A plate 3 to be processed is entered in the nip of the rolls 37 and is fed forward thereby under the developer nozzle 15 and under the sponge 11 to the rolls 39. As it travels under the nozzle 15, the stream of developer issuing from this nozzle flows onto the upper face of the plate and, since the nozzle is moving from side-to-side with respect to the plate, the developer is efficiently distributed across the upper face of the plate. In this respect, it is to be observed that the speed of feed of the plate and the speed of the nozzle are so related that the nozzle travels from one side of the plate to the other in substantially less time than the time of travel of the plate under the nozzle. For example, the plate may be fed forward at the rate of two and one-half to three feet per minute, and the carriage may be traversed back and forth seven to ten times per minute. The developer is laid down on the plate in lines which extend from one side of the plate to the other somewhat off perpendicular with respect to lines extending longitudinally of the plate path.

As the plate, with the developer on its upper face, travels out from under the nozzle 15, it passes over the platen 151 and under the sponge 11, which operates with the stated orbital motion to rub the developer over the upper face of the plate for developing it. The plate then enters the nip of rolls 39, before its trailing edge exits from the nip of rolls 37, and is fed forward by rolls 39 between the two water spray pipes 218 and 219 and over the platen 229 and under the brush 227 to the rolls 41. Nozzle 215 delivers water onto the upper roll 39a of set 39 continuously to wash it for purposes aforementioned. The sprays from 218 and 219 wash off the upper and lower faces of the plate, and the brush 227 scrubs off any developer which may have remained on the plate.

The plate enters the nip of rolls 41 before its trailing edge exits from rolls 39, and is fed forward by rolls 41 under the preservative nozzle 207 and thence under the brush 267 to the rolls 43. Roll 41a picks up water from the upper face of the plate for drying it. As it travels under the nozzle 207, the stream of preservative issuing from this nozzle flows onto the upper face of the plate and, since the nozzle is moving from side-to-side with respect to the plate, the preservative is efficiently distributed across the upper face of the plate in the same manner as the developer. Then it is brushed over the upper face of the plate by the brush 267.

The plate enters the nip of rolls 43 before its trailing edge exits from rolls 41, and is fed forward by rolls 43 between the channels 69 and 71, where air is blown on the plate to dry it. It then enters the nip of rolls 45 before its trailing edge exits from rolls 43, and is suitably stacked.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for processing exposed lithographic plates comprising means for continuously feeding an exposed plate along a predetermined path with the exposed sensitized face of the plate facing up, means for delivering a developer for the plate onto the upper face of the plate with the developer distributed across the upper face of the plate, and means downstream from said developer delivery means for rubbing the developer over the upper face of the plate, said developer rubbing means comprising a rubbing member extending generally across the width of a plate being fed forward thereunder and means for moving said rubbing member at least laterally back and forth relative to said path to rub in the developer, the means for delivering the developer onto the upper face of the plate for being rubbed over the upper face of the plate comprising nozzle means for delivering developer onto the upper face of the plate as the plate is fed forward by said feeding means, means mounting the nozzle means for movement generally transversely of said path, means for moving the nozzle means generally transversely of said path back and forth over the plate with the nozzle means and its range of movement such that it applies developer generally throughout the width of the plate, and means for continuously pumping developer from a supply through the nozzle means for continuous delivery of developer onto the upper face of the plate as the nozzle means moves back and forth over the plate.

2. Apparatus as set forth in claim 1 wherein the means mounting the nozzle means for movement laterally of said path comprises a carriage movable laterally with respect to said path, the nozzle means being carried by the carriage in position to deliver developer downwardly onto the upper face of a plate as the carriage moves laterally back and forth over the plate.

3. Apparatus as set forth in claim 2 having flexible hose means for delivering developer to the nozzle means, the hose means flexing as the carriage moves from side to side.

4. Apparatus as set forth in claim 2 wherein the nozzle means is constituted by a single nozzle and the carriage is movable to move the single nozzle laterally from adjacent one side of a plate to adjacent the other side of the plate.

5. Apparatus as set forth in claim 4 having a flexible hose connected to the single nozzle for delivering developer to the nozzle, the hose flexing as the nozzle moves laterally from adjacent one side of a plate to adjacent the other side of the plate.

6. Apparatus as set forth in claim 1 wherein said plate feeding means comprises a first set of rolls upstream from the nozzle means and a second set of rolls downstream from the rubbing means for feeding a plate forward, each set comprising an upper roll and a lower roll, and wherein means is provided below the nozzle means for collecting developer delivered by the nozzle means which misses a plate.

7. Apparatus as set forth in claim 6 having means for holding a supply of developer, means for pumping developer from the supply to the nozzle means, and means for returning developer from the developer collecting means to said supply means.

8. Apparatus for processing exposed lithographic plates comprising means for continuously feeding an exposed plate along a predetermined path with the exposed sensitized face of the plate facing up, means for delivering a developer for the plate onto the upper face of the plate with the developer distributed across the upper face of the plate, and means downstream from said developer delivery means for rubbing the developer over the upper face of the plate, said developer rubbing means comprising a rubbing member extending generally across the width of a plate being fed forward thereunder and means for moving said rubbing member at least laterally back and forth relative to said path to rub in the developer, the means for delivering the developer onto the upper face of the plate for being rubbed over the upper face of the plate comprising nozzle means for delivering developer onto the upper face of the plate as the plate is fed forward by said feeding means, means mounting the nozzle means for movement generally transversely of said path, means for moving the nozzle means generally transversely of said path back and forth over the plate with the nozzle means and its range of movement such that it applies developer generally throughout the width of the plate, said plate feeding means comprising a first set of rolls upstream from the nozzle means and a second set of rolls downstream from the rubbing means for feeding a plate forward, each set comprising an upper roll and a lower roll, said apparatus further having nozzle means for delivering water onto the upper roll of said second set, said water delivery nozzle means being movable generally transversely of said path with said developer delivery nozzle means.

9. Apparatus for processing exposed lithographic plates comprising means for continuously feeding an exposed plate along a predetermined path with the exposed sensitized face of the plate facing up, means for delivering a developer for the plate onto the upper face of the plate with the developer distributed across the upper face of the plate, and means downstream from said developer delivery means for rubbing the developer over the upper face of the plate, said developer rubbing means comprising a rubbing member extending generally across the width of a plate being fed forward thereunder and means for moving said rubbing member at least laterally back and forth relative to said path to rub in the developer, the means for delivering the developer onto the upper face of the plate for being rubbed over the upper face of the plate comprising nozzle means for delivering developer onto the upper face of the plate as the plate is fed forward by said feeding means, means mounting the nozzle means for movement generally transversely of said path, means for moving the nozzle means generally transversely of said path back and forth over the plate with the nozzle means and its range of movement such that it applies developer generally throughout the width of the plate, the means mounting the nozzle means for movement laterally of said path comprising a carriage movable laterally with respect to said path, the nozzle means being carried by the carriage in position to deliver developer downwardly onto the upper face of a plate as the carriage moves laterally back and forth over the plate, said plate feeding means comprising a first set of rolls upstream from the nozzle means and a second set of rolls downstream from the rubbing means for feeding a plate forward, each set comprising an upper roll and a lower roll, and said apparatus further comprising nozzle means for delivering water onto the upper roll of said second set, said water delivery nozzle means being carried by said carriage in position to deliver water onto said upper roll of said second set as the carriage moves laterally back and forth.

10. Apparatus as set forth in claim 9 wherein the water delivery nozzle means is constituted by a single nozzle and the carriage is movable to move said single water delivery nozzle laterally from adjacent one end of said upper roll of said second set to adjacent its other end.

11. Apparatus as set forth in claim 10 having a flexible hose connected to said single water delivery nozzle for delivering water thereto, the hose flexing as the water delivery nozzle moves from end to end of said upper roll of said second set.

12. Apparatus for processing exposed lithographic plates comprising means for continuously feeding an exposed plate along a predetermined path with the exposed sensitized face of the plate facing up, means for delivering a developer for the plate onto the upper face of the plate with the developer distributed across the upper face of the plate, and means downstream from said developer delivery means for rubbing the developer over the upper face of the plate, said developer rubbing means comprising a rubbing member extending generally across the width of a plate being fed forward thereunder and means for moving said rubbing member at least laterally back and forth relative to said path to rub in the developer, the means for delivering the developer onto the upper face of the plate for being rubbed over the upper face of the plate comprising nozzle means for delivering developer onto the upper face of the plate as the plate is fed forward by said feeding means, means mounting the nozzle means for movement generally transversely of said path, means for moving the nozzle means generally transversely of said path back and forth over the plate with the nozzle means and its range of movement such that it applies developer generally throughout the width of the plate, said apparatus further having means for spraying water on the upper face of a plate downstream from said rubbing means to wash off excess developer, means for delivering a preservative for the plate onto the upper face of the plate downstream from the water spraying means with the preservative distributed across the upper face of the plate, and means downstream from the preservative delivery means for rubbing the preservative over the upper face of the plate, the preservative delivery means comprising nozzle means for delivering preservative onto the upper face of the plate as the plate is fed forward by said feeding means, means mounting said preservative nozzle means for movement laterally of said path, and means for moving said preservative nozzle means laterally of said path back and forth over the plate with the preservative nozzle means and its range of movement such that the preservative nozzle means applies preservative generally throughout the width of the plate.

13. Apparatus as set forth in claim 12 wherein said plate feeding means comprises a first set of rolls upstream from the developer delivery nozzle means, a second set of rolls downstream from the developer rubbing means, a third set of rolls downstream from the water spray means, and a fourth set of rolls downstream from the preservative rubbing means, and wherein means is provided below the preservative nozzle means for collecting preservative delivered by the preservative nozzle means which misses a plate.

14. Apparatus as set forth in claim 13 having means for holding a supply of preservative, means for pumping preservative from the preservative supply to the preservative nozzle means, and means for returning preservative from the preservative collecting means to said preservative supply means.

15. Apparatus as set forth in claim 13 having means for removing preservative from the upper roll of the fourth set of rolls.

16. Apparatus as set forth in claim 15 further having means for dampening the lower roll of the fourth set of rolls.

17. Apparatus as set forth in claim 15 wherein said preservative removing means comprises a sponge extending lengthwise of and in contact with the upper roll of the fourth set, and sponge-dampening nozzle means for delivering water to the sponge, movable back and forth along the length of the sponge.

18. Apparatus as set forth in claim 17 having valve means for adjusting the flow of water to said sponge-dampening nozzle means to a rate such as to maintain the sponge only damp.

19. Apparatus as set forth in claim 18 further having means for dampening the lower roll of the fourth set of rolls comprising a pan for holding water under said lower roll, and means for delivering water to said pan at a rate such as to maintain water therein for wetting the lower roll.

20. Apparatus as set forth in claim 17 wherein the means mounting the developer nozzle means and the preservative nozzle means comprises a carriage movable laterally with respect to the path of the plates, and wherein the sponge-dampening nozzle means is also carried by said carriage.

21. Apparatus as set forth in claim 12 having means for collecting water which has been delivered by said water spraying means, means for pumping the water back to said water spraying means, and means for filtering the water pumped back to the water spraying means.

22. Apparatus as set forth in claim 21 having means for adding make-up water to the water collected by said collecting means.

23. Apparatus as set forth in claim 21 wherein said collecting means comprises a first chamber to which water which has been delivered by said water spraying means is drained, a second chamber for make-up water adapted to overflow into the first chamber when the water in the second chamber rises above a predetermined level, means for delivery of water from a supply to said second chamber comprising a line extending into said second chamber and a valve for said line in said second chamber, and means operable when water is drawn down below a predetermined level in the first chamber for opening the valve for delivery of water from the supply to the second chamber and for closing the valve when the water in the first chamber rises to the latter level.

24. Apparatus as set forth in claim 23 wherein said line extends up into said second chamber and has said valve at its upper end, said means for opening and closing the valve comprising a float in the first chamber on a valve-operating arm extending from the valve to the first chamber.

25. Apparatus as set forth in claim 23 having nozzle means for delivering water onto the upper roll of the second set, a sponge extending lengthwise of and in contact with the upper roll of the fourth set, sponge-dampening nozzle means for delivering water to the sponge said water delivery nozzle means and said sponge-dampening nozzle means being movable generally transversely of said path with said developer delivery nozzle means, a drain pan below said water spraying means, said water delivery nozzle means and said sponge-dampening nozzle means, means for collecting water draining from said drain pan, means for pumping the water back to said water spray means, said water delivery nozzle means and said sponge-dampening nozzle means, and means for filtering the pumped-back water.

26. Apparatus as set forth in claim 25 having means for adding make-up water to the water collected by said collecting means.

27. Apparatus as set forth in claim 24 wherein said collecting means comprises a first chamber to which water which has been delivered by said water spraying means is drained, a second chamber for make-up water adapted to overflow into the first chamber when the water in the second chamber rises above a predetermined level, means for delivery of water from a supply to said second chamber comprising a line extending into said second chamber and a valve for said line in said second chamber, and means operable when water is drawn down below a predetermined level in the first chamber for opening the valve for delivery of water from the supply to the second chamber and for closing the valve when the water in the first chamber rises to the latter level.

28. Apparatus as set forth in claim 27 wherein said line extends up into said second chamber and has said valve at its upper end, said means for opening and closing the valve comprising a float in the first chamber on a valve-operating arm extending from the valve to the first chamber.

29. Apparatus for processing exposed lithographic plates comprising means for continuously feeding an exposed plate along a predetermined path with the exposed sensitized face of the plate facing up, means for delivering a developer for the plate onto the upper face of the plate with the developer distributed across the upper face of the plate, and means downstream from said developer delivery means for rubbing the developer over the upper face of the plate, said developer rubbing means comprising a rubbing member extending generally across the width of a plate being fed forward thereunder and means for moving said rubbing member at least laterally back and forth relative to said path to rub in the developer, the means for delivering the developer onto the upper face of the plate for being rubbed over the upper face of the plate comprising nozzle means for delivering developer onto the upper face of the plate as the plate is fed forward by said feeding means, means mounting the nozzle means for movement generally transversely of said path, means for moving the nozzle means generally transversely of said path back and forth over the plate with the nozzle means and its range of movement such that it applies developer generally throughout the width of the plate, the means mounting the nozzle means for movement laterally of said path comprising a carriage movable laterally with respect to said path, the nozzle means being carried by the carriage in position to deliver developer downwardly onto the upper face of a plate as the carriage moves laterally back and forth over the plate, said apparatus further having means for spraying water on the upper face of a plate downstream from said rubbing means to wash off excess developer, means for delivering a preservative for the plate onto the upper face of the plate downstream from the water spraying means with the preservative distributed across the upper face of the plate, and means downstream from the preservative delivery means for rubbing the preservative over the upper face of the plate, the preservative delivery means comprising nozzle means for delivering preservative onto the upper face of the plate as the plate is fed forward by said feeding means, the preservative nozzle means being carried by said carriage in position to deliver preservative onto the upper face of the plate as the carriage moves laterally back and forth.

30. Apparatus as set forth in claim 29 wherein the preservative nozzle means is constituted by a single nozzle and the carriage is movable to move said single preservative nozzle laterally from adjacent one side of a plate to adjacent the other side of the plate.

31. Apparatus as set forth in claim 30 having a flexible hose connected to said single preservative delivery nozzle for delivering preservative thereto, the hose flexing as the preservative delivery nozzle moves from end to end of said upper roll of said second set.

32. The method of processing exposed lithographic plates comprising continuously feeding an exposed plate forward along a predetermined path with the exposed sensitized face of the plate facing up, directing a stream of developer toward the upper face of the plate and traversing the stream generally transversely of said path back and forth over the plate with the stream and its range of movement such as to apply developer generally throughout the width of the plate as the plate is fed forward, and rubbing the developer over the upper face of the plate as it continues being fed forward.

33. The method of claim 32 further comprising spraying water on the upper face of the plate as the plate continues being fed forward and after the rubbing in of the developer to wash off excess developer, delivering a preservative onto the upper face of the plate as the plate continues being fed forward and after the water spraying, and rubbing the preservative over the upper face of the plate as the plate continues being fed forward.

* * * * *